United States Patent [19]
Stahl

[11] Patent Number: 6,060,931
[45] Date of Patent: May 9, 2000

[54] REPETITIVE PULSE GENERATOR WITH WIDE PULSE DURATION, AMPLITUDE, FREQUENCY AND DUTY CYCLE CHARACTERISTICS

[76] Inventor: George J. Stahl, 428 Ben Oaks Dr. East, Severna Park, Md. 21146

[21] Appl. No.: 09/072,772

[22] Filed: May 6, 1998

[51] Int. Cl.[7] .................................................. H03K 3/02
[52] U.S. Cl. .......................................... 327/291; 172/178
[58] Field of Search .................................. 327/172, 173, 327/174, 175, 176, 178, 179, 180, 291

[56] References Cited

U.S. PATENT DOCUMENTS

| | | | |
|---|---|---|---|
| 3,492,593 | 1/1970 | Ullmann et al. | 331/54 |
| 3,644,840 | 2/1972 | Conner | 331/107 T |
| 4,567,448 | 1/1986 | Ikeda | 331/17 |
| 5,008,563 | 4/1991 | Kenney et al. | 327/176 |
| 5,138,187 | 8/1992 | Matsushima et al. | 327/178 |

OTHER PUBLICATIONS

Stahl, G.J., "Pulse Generator with Expanded Ranges of Adjustability", NASA Tech Briefs vol. 20, No. 8, GSC–13650, Aug. 1996, pp. 46–48.

*Primary Examiner*—Timothy P. Callahan
*Assistant Examiner*—Terry L. Englund

[57] ABSTRACT

A pulse generator provides a continuous train of electrical pulses of variable frequency, duration and amplitude. The pulse generator includes an adjustable frequency astable oscillator coupled to a monostable pulse generator. An isolation circuit isolates the output of the monostable pulse generator from loading effects to minimize output waveform jitter. A power amplifier receives the isolated pulse signal from the monostable pulse generator and provides output pulses of sufficient energy to simultaneously power continuous and capacitive electrical loads with minimal effect on the pulse generator output pulse waveshape.

9 Claims, 6 Drawing Sheets

APPLICATION NO. - 09/072,772

REPETITIVE PULSE GENERATOR WITH WIDE PULSE DURATION, AMPLITUDE, FREQUENCY AND DUTY CYCLE CHARACTERISTICS

BACKGROUND OF THE INVENTION

This invention pertains to apparatus for providing a continuous train of repetitive electrical pulses, rectangular in shape, of variable frequency, duration, and amplitude commonly known as a pulse generator.

Pulse generators produced by several manufacturers are readily available in the marketplace. These electronic instruments, however, have operational limitations and deficiencies. Each pulse generator requires several frequency and duration ranges to cover the same territory that the invention described herein does with single adjustment ranges for pulse duration and frequency. Moreover, presently available pulse generators exhibit an instability wherein the output waveform period, T, abruptly changes to approximately 2T after the user has established, or, while the user is attempting to establish an output waveform with a high duty cycle; e.g. approximately 94%. or greater. Furthermore, the available electronic instruments experience reductions in output pulse amplitude of 50%. or greater when providing pulses to loads of 100 milliamperes (mA) and also experience sharp increases in output pulse rise and fall times when supplying pulses to capacitive loads such as the input impedance of a high current power metal oxide semiconductor field-effect transistor (MOSFET).

SUMMARY OF THE INVENTION

An object of this invention is to provide a pulse generator that generates a repetitive train of pulses of variable frequency, duration, and amplitude with no interaction between the various adjustments.

Another object of the invention is to provide a pulse generator having a better than 10,000:1 frequency range with a single adjustment.

Yet another object of the invention is to provide a pulse generator having a wide output pulse duration range with a single adjustment.

A further object of the invention is to provide a pulse generator that exhibits minimal output waveform jitter at low frequencies.

Still another object of the invention is to provide a pulse generator that can provide output pulses with sufficient energy to simultaneously power continuous and capacitive loads with minimal effect on the output pulse waveshape.

An additional object of the invention is to provide a pulse generator with complementary outputs that supply output waveforms with fast rise and fall times irrespective of the load being supplied.

Another object of the invention is to provide a pulse generator with an output frequency range that exceeds the limits of the audio frequency range.

Yet another object of the invention is to provide a pulse generator that is less complex, smaller, and less expensive than existing comparable instruments.

A further object of the invention is to provide a pulse generator that eliminates an instability exhibited by commercially available comparable electronic instruments.

Other objects, features and advantages of my invention will become apparent from the ensuing description of the invention which refers to the accompanying drawings.

In brief, the pulse generator described herein includes the following electrical circuitry. An astable oscillator that generates a repetitive rectangular waveform of variable frequency coupled to a monostable pulse generator that subsequently generates pulses of variable frequency and duration. An electrical isolation circuit isolates the output of the monostable pulse generator from loading effects in order to minimize jitter of the pulse generator output waveforms. A power amplifier with complementary outputs receives the electrically isolated signal from the monostable pulse generator and provides output pulses of variable frequency, duration and amplitude with sufficient energy to simultaneously power continuous and capacitive loads with minimal effect on the pulse generator output pulse waveshape. Three individual dc voltage regulators provide power to the aforementioned electrical circuitry contained within the pulse generator, and low-pass filters function in concert with the aforementioned electrical isolation circuit in minimizing jitter of the pulse generator output waveforms.

DETAILED DESCRIPTION OF THE EMBODIMENTS OF THE INVENTION

Figure 1A:
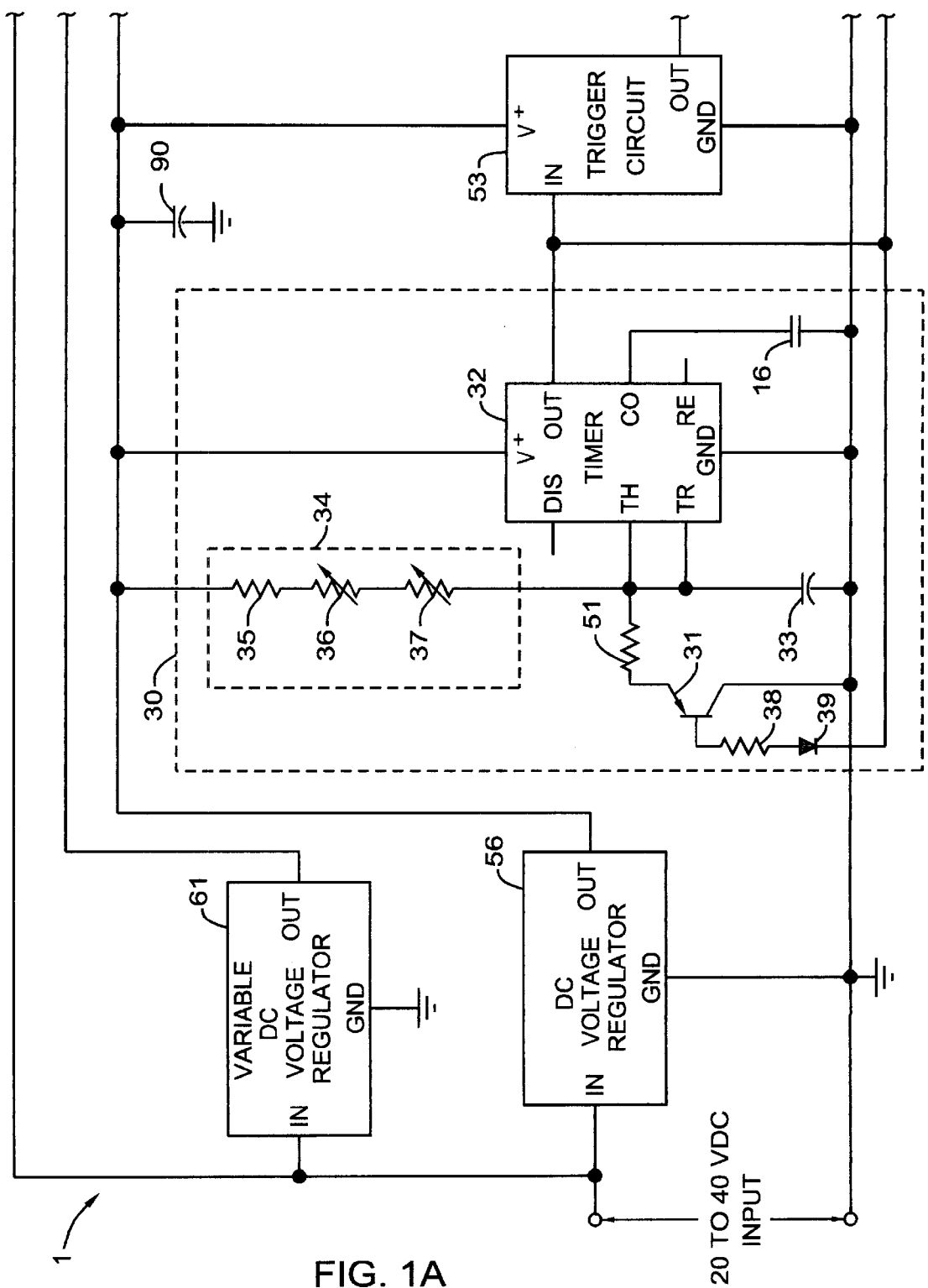
FIGS. 1A and 1B show a schematic of a circuit for generating a continuous train of repetitive electrical pulses of variable frequency, duration, and amplitude.
Figure 1B:
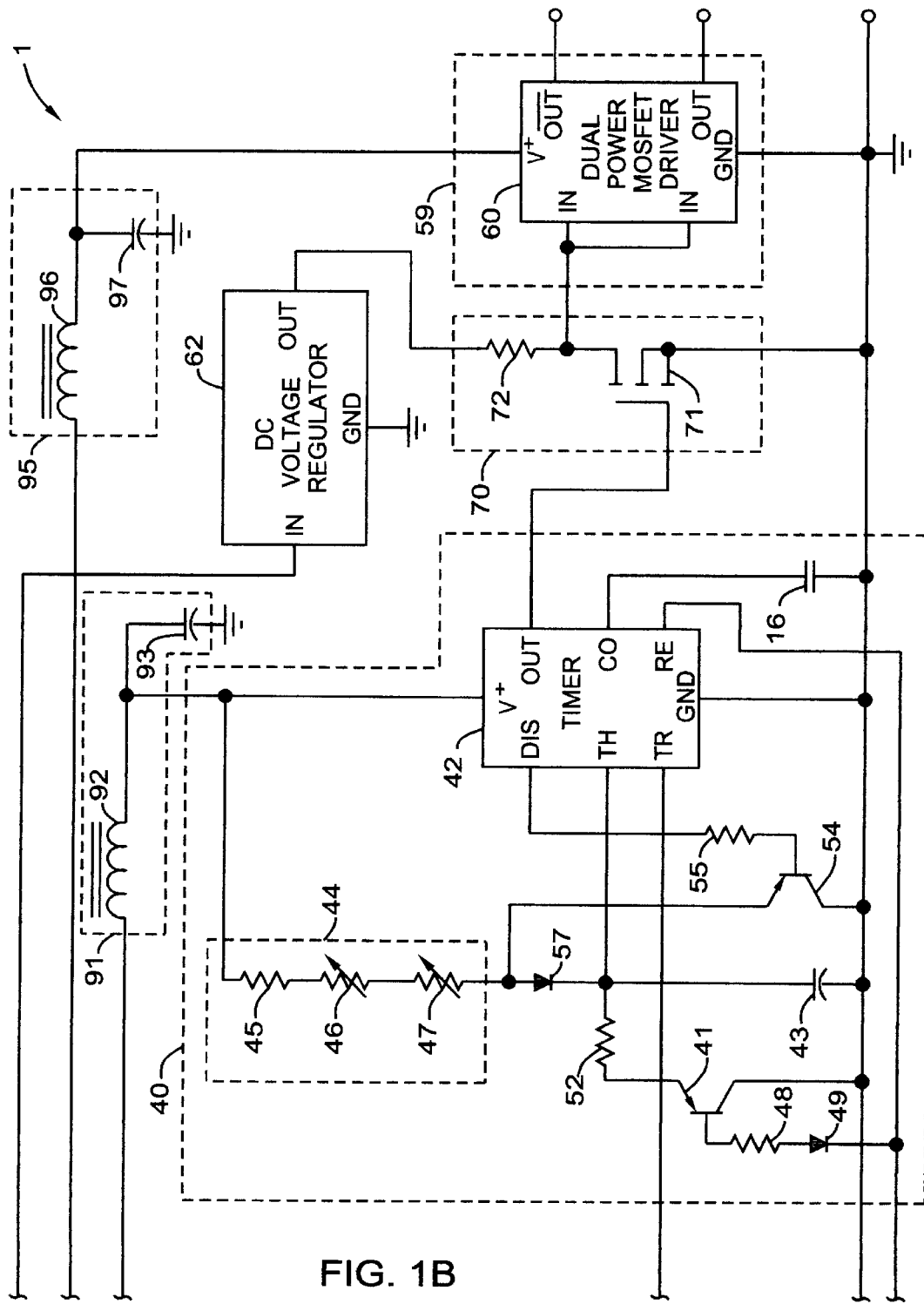

FIGS. 1A and 1B show the electrical schematic of the invention; a pulse generator 1, hereinafter simply referred to as the generator, that provides a continuous train of pulses of variable frequency, duration, and amplitude. The generator includes an adjustable frequency astable (AFA) oscillator 30 and a monostable variable duration pulse generator 40, hereinafter designated a one-shot. The AFA oscillator 30 and one-shot 40 are improved versions of the basic AFA oscillator 10 and one-shot 20 electrical circuit configurations shown in FIG. 2 and FIG. 3 respectively, each circuit configuration employing a popular integrated circuit (IC) timer denoted in the electronics industry as 555 with various letter prefixes and suffixes. The 555 IC timer utilized has eight pinouts; dc supply voltage, electrical ground, discharge, threshold, trigger, reset, output, and control with corresponding terminal designations, V, GND, DIS, TH, TR, RE, OUT, and CO respectively as shown in FIGS. 1A, 1B, 2 and 3. The control function, CO, is not being used in any of the aforementioned 555 IC timer applications and is bypassed to electrical ground by a capacitor 16, as shown in FIGS. 1A, 1B, 2 and 3, for electrical noise filtering.

Figure 4A:
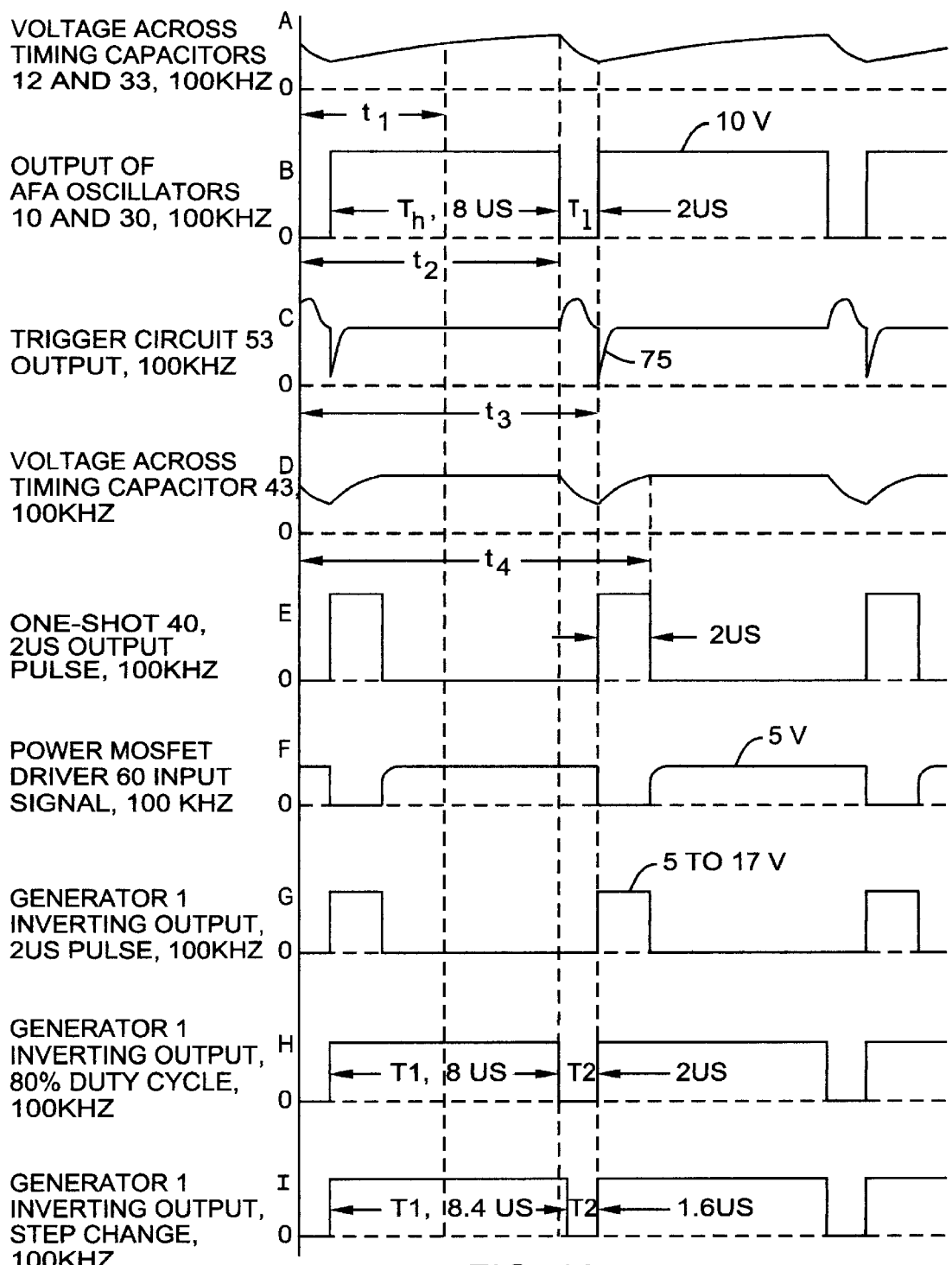
FIGS. 4A and 4B are a graph showing idealized waveforms at various points in the circuit shown in FIGS. 1A and 1B to illustrate the operation of the invention.

In FIG. 4A, waveforms A and B illustrate the varying voltage across the timing capacitor 12 and the output voltage waveform generated by the AFA oscillator 10 respectively with the circuit operating at 100 kHz. These two waveforms are produced in the following manner. At the time $t_1$ of the waveforms A and B, the timing capacitor 12 is charging higher through the resistors 13 and 15 and the variable resistor (potentiometer) 14, and the AFA oscillator 10 (and IC timer 11) output voltage waveform is high as shown. At the time $t_2$, (see waveforms A and B) when the voltage across the timing capacitor 12 reaches the threshold voltage level of the IC timer 11, the IC timer output goes low and a discharge transistor contained within the IC timer simultaneously turns on. The timing capacitor 12 then discharges through the resistor 15 and the collector of the aforementioned internal discharge transistor, the voltage across the timing capacitor decaying to the IC timer 11 trigger voltage at the time $t_3$ (see waveform A). At this lower voltage level, the IC timer 11 retriggers and the IC timer output voltage waveform consequently goes high again, the IC timer internal discharge transistor turns off, and the timing capacitor 12 starts recharging with the operational cycle just described being repeated continuously thereby generating the oscillatory waveforms A and B shown in FIG. 4A. The free-running frequency of the AFA oscillator 10 is controlled by varying the potentiometer 14. The free-running (or operating) frequency range is governed by the capacitance value of the timing capacitor 12.

The basic AFA oscillator 10, however, has the following design limitations. The magnitude of the current permitted to flow through the collector of the IC timer 11 internal discharge transistor is intentionally limited via the internal circuit design of the 555 IC timer. This is done to limit the power dissipated within the IC timer 11 internal discharge transistor that results from two currents, the constant load current contribution through the resistor 13 and potentiometer 14, and the exponentially decaying current contribution from the timing capacitor 12, both of which flow simultaneously through the collector of the IC timer internal discharge transistor when it turns on. As a result, the minimum time it takes for the voltage across the timing capacitor 12 to decay down to the IC timer 11 trigger voltage level is dependent primarily on the component values of the timing capacitor 12 and discharge resistor 15, and secondarily on the resistance value of the resistor 13 with the potentiometer 14 set at zero ohms. These design considerations therefore significantly limit the operating frequency range of the basic AFA oscillator 10 for a selected timing capacitance value. For example, to operate at high frequencies, i.e., 100 kHz, as shown in FIG. 4A (see waveforms A and B), values of timing capacitance in the nanofarad (nF) range are normally used. For lower frequencies such as 10 Hz, timing capacitance values in the microfarad (uF) range are typically used. Consequently, a considerable number of selected timing capacitance values are required to cover the entire 10 Hz to 100 kHz operating frequency range.

Figure 3:
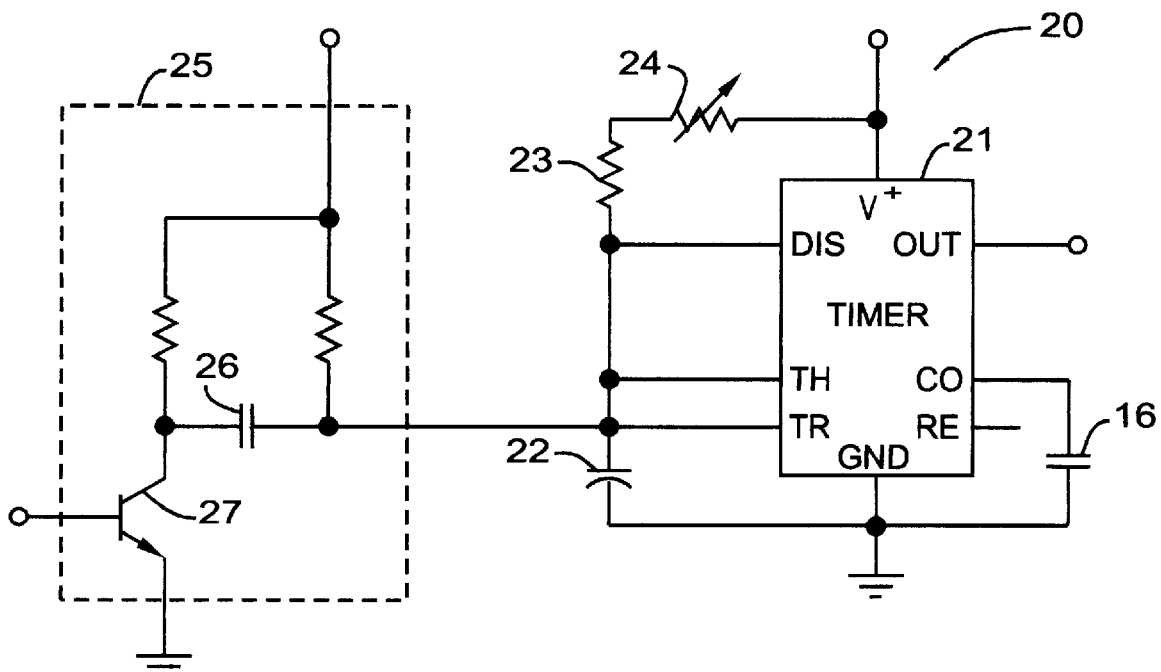
FIG. 3 shows a schematic of a basic 555 integrated circuit timer monostable variable duration pulse generator circuit.

The basic one shot circuit 20 in FIG. 3 is designed to provide a single output pulse signal of variable duration only when triggered. Under quiescent conditions the IC timer 21 internal discharge transistor is shorting the timing capacitor 22 to ground, and other internal IC timer circuitry is holding the IC timer output signal voltage low. To generate an output pulse signal, the trigger circuit 25 generates a negative-going voltage spike, the peak amplitude of which drops below the IC timer 21 trigger voltage level, which is applied to the IC timer trigger terminal. A suitable narrow voltage spike is normally generated by momentarily grounding one terminal of a coupling capacitor 26 through a transistor switch 27. When the IC timer 21 triggers, the IC timer internal discharge transistor turns off and the IC timer output signal voltage goes high. The timing capacitor 22 then begins charging through the resistor 23 and potentiometer 24, the voltage across the timing capacitor increasing exponentially. When the voltage across the timing capacitor 22 reaches the IC timer 21 threshold voltage level, the IC timer output signal goes low and the IC timer internal discharge transistor turns on. The timing capacitor 22 then discharges through the collector of the IC timer 21 internal discharge transistor which remains on thereby holding the output of the IC timer (and one-shot 20) low until another trigger spike occurs. The duration of the one-shot 20 output pulse signal is varied by adjusting the potentiometer 24. The pulse signal duration range is dependent on the capacitance value of the timing capacitor 22. Since the basic one-shot circuit 20 uses the same 555 IC timer as the basic AFA oscillator 10, the same design limitations apply. It takes several selected timing capacitance values to provide output pulse signals ranging in duration from several microseconds to tens of milliseconds.

Figure 2:
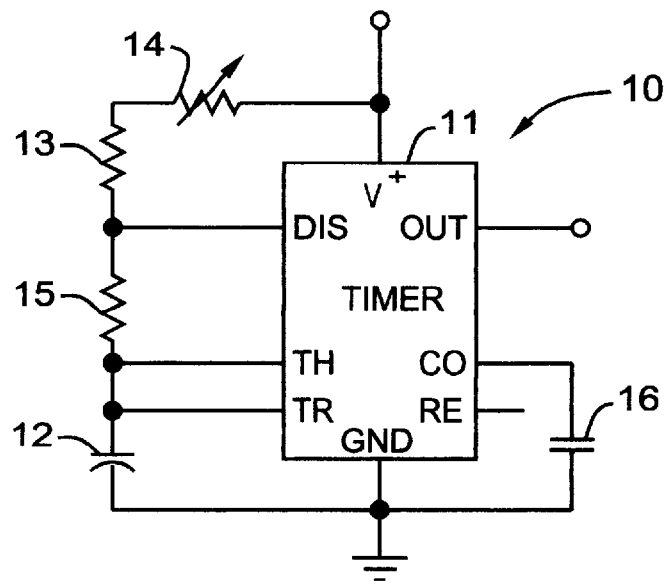
FIG. 2 shows a schematic of a basic 555 integrated circuit timer adjustable frequency astable oscillator circuit.

To circumvent the above described design limitations, the basic circuits in FIGS. 2 and 3 were modified by incorporating the external pnp transistors 31 and 41 shown in FIGS. 1A and 1B respectively. The transistor 31 functions to discharge the timing capacitor 33 instead of the IC timer 32 internal discharge transistor. Similarly, the transistor 41 functions to discharge the timing capacitor 43 instead of the IC timer 42 internal discharge transistor. This design modification bypasses the current limiting function designed into the internal circuitry of the 555 IC timers 32 and 42 and also reduces the power dissipated within the two IC timers to a negligible amount since the external transistors 31 and 41 now conduct the discharge currents from the timing capacitors 33 and 43 and the constant load current contributions through the charging resistances 34 and 44 respectively instead of the discharge transistors within the two IC timers. Consequently, very few values of timing capacitance are required to provide very wide frequency and pulse duration ranges. Although the AFA oscillators 10 and 30 and the one-shots 20 and 40 operate differently due to the circuit modifications that were made (compare FIGS. 1A and 2, and 1B and 3) as will be described further on, the voltage waveforms across the timing capacitors 12 and 33 are identical as are the output voltage waveforms of the AFA oscillators 10 and 30, and one-shots 20 and 40 respectively. The voltage waveforms across the timing capacitors 22 and 43, however, differ. Hence, the waveforms A and B in FIG. 4A also represent the varying voltage across the timing capacitor 33 and the output voltage waveform generated by the AFA oscillator 30 respectively with the AFA oscillator operating at 100 kHz.

The AFA oscillator 30, and thereby the generator, operating frequency range is dependent on the capacitance value of the timing capacitor 33 and the resistance values of the resistor 35 and potentiometers 36 and 37 which comprise the charging resistance 34. The desired generator operating frequency, 100 kHz in this example, is set precisely by varying potentiometers 36 and 37 which are coarse and fine adjustments respectively. The cited publication details the numerics and component values of every electrical circuit element contained in the generator. With the component values presented therein, the generator operating frequency can be varied from 14.7 Hz to 167 kHz; better than a 10,000:1 range with a single timing capacitance value. Hence, the generator advantageously exceeds the 20 Hz to 20 kHz audio frequency range. Both bipolar and CMOS 555 IC timers can be utilized in the generator with a CMOS 555 IC timer yielding slightly higher frequencies ranging from 17 Hz to 185 kHz. A bipolar 555 IC timer is preferable, however, since it exhibited less frequency drift than the equivalent CMOS unit during laboratory experiments.

The one-shot 40 pulse signal duration is similarly dependent on the capacitance value of the timing capacitor 43 and the resistance values of the resistor 45 and potentiometers 46 and 47 which comprise the charging resistance 44. The desired pulse signal duration is obtained by varying potentiometers 46 and 47 which are coarse and fine adjustments respectively as in the AFA oscillator 30. The one-shot 40 pulse signal duration can be varied from 2 us, which is the shortest duration pulse signal that the generator can provide, to a maximum of 68 ms, a 34,000:1 range, with a single timing capacitance value. The generator provides output waveforms with a duty cycle range of 20%. to 80% at 100 kHz to a nearly infinite duty cycle range at low frequencies, and was designed so that the AFA oscillator 30 and one-shot 40 timing capacitors 33 and 43, and equivalent potentiometers 36 and 46, and 37 and 47, have identical component values. Power to the one-shot 40, AFA oscillator 30, and trigger circuit 53 is supplied by a 10 V dc voltage regulator 56 as shown in FIGS. 1A and 1B.

Waveform D in FIG. 4A illustrates the varying voltage across the timing capacitor 43 with the one-shot 40 charging resistance 44 adjusted to generate pulse signals with a 2 us duration. Waveform E illustrates the aforementioned 2 us duration pulse signals provided by the one-shot 40. At the time $t_1$ of the waveforms A and B, the timing capacitor 33 is charging higher through the charging resistance 34 and the AFA oscillator 30 (and IC timer 32) output voltage waveform B is high as shown. At the same time, the voltage across the timing capacitor 43 is held fixed at the threshold voltage level of the timer 42, as shown by waveform D, which is in contrast to the operation of the basic one-shot 20 in FIG. 3 wherein the timing capacitor 22 would have already been discharged at the time $t_1$. The one-shot 40 (and IC timer 42) output is low at the time $t_1$ with the one-shot already having generated a 2 us duration pulse (see waveform E). Progressing now to the time $t_2$ (see waveforms A and B), when the voltage across the timing capacitor 33 reaches the threshold voltage level of the IC timer 32, the IC timer output goes low.

The 555 IC timer internal output circuitry has the capability to source current when the IC timer output is high and sink current when the IC timer output is low. The latter capability is vital for the operation of the generator and is utilized to discharge the timing capacitors 33 and 43 as follows.

Referring again to waveform B, when the IC timer 32 output goes low at the time $t_2$, a transistor in the IC timer internal output circuity turns on the external discharge transistors 31 and 41 simultaneously by sinking base current from these transistors through the resistors 38 and 48 and the blocking diodes 39 and 49 respectively, the cathodes of which are connected to the output terminal of the IC timer 32. The timing capacitors 33 and 43 then discharge simultaneously through the discharge resistors 51 and 52 respectively with the voltage across the timing capacitors decreasing exponentially at identical rates of decay. It takes 2 us for the voltage across the timing capacitor 33 to decay to the trigger voltage level of the IC timer 32 at which point, the time $t_3$ of the waveforms A and B, the IC timer output goes high. The duration, $T_1$, (see waveform B) that the AFA oscillator 30 output is low stays fixed at 2 us throughout the entire AFA oscillator operating frequency range and is dependent on the component values of the timing capacitor 33 and the discharge resistor 51. The duration, $T_h$, that the AFA oscillator 30 output is high (see waveform B) varies with the operating frequency from a minimum of 4.4 us to a maximum of approximately 68 ms. When the IC timer 32 output goes high, the blocking diodes 39 and 49 are reversed biased thereby shutting off the discharge transistors 31 and 41 respectively. The blocking diodes 39 and 49 serve to protect the base-to-emitter junctions of the discharge transistors 31 and 41 respectively from reverse voltage breakdown when the output voltage of the IC timer 32 is much higher than the voltage across the timing capacitors 33 and 43, particularly at the time $t_3$ when the voltage differential is the greatest. With both of the discharge transistors 31 and 41 shut off, the timing capacitor 33 starts recharging slightly before the timing capacitor 43 which begins recharging after the IC timer 42 is triggered as follows.

The output of the IC timer 32 is connected to the input of the trigger circuit 53 which is activated when the output of the IC timer goes high at the time $t_3$ (see waveform B). The internal circuit configuration and operation of the trigger circuit 53 is very similar to that of the trigger circuit 25 shown in FIG. 3 and is therefore not shown in detail in FIG. 1A. Upon activation, the output of the trigger circuit 53 emits a negative-going voltage spike 75 (see waveform C) which is applied to the trigger input terminal of the IC timer 42 thereby causing the output of the IC timer 42 to go high. When the output of the IC timer 42 goes high, the IC timer internal discharge transistor, which was holding the transistor 54 on by sinking base current from the transistor through the resistor 55, turns off. The transistor 54, which was diverting charging current away from the timing capacitor 43 to electrical circuit ground, then turns off and the timing capacitor begins charging through the charging resistance 44 toward the 10 V dc bus voltage. When the voltage across the timing capacitor 43 reaches the threshold voltage level of the IC timer 42 at the time $t_4$ of the waveform D, the IC timer output goes low thus completing the formation of the 2 us duration pulse signal shown by waveform E in FIG. 4A.

To prevent the generator from exhibiting the previously described instability problem present in existing comparable electronic instruments, it is necessary to:

a. prevent the discharge of the one-shot 40 timing capacitor 43 after the one-shot times out (completes the formation of a pulse signal); and b. force the output of the one-shot 40 IC timer 42 to go low concurrently with the AFA oscillator 30 IC timer 32 output should the IC timer 42 output still be high when the IC timer 32 output goes low in order to discharge the timing capacitors 33 and 43 simultaneously as described above. The latter of the two-circuit operations is easily accomplished by simply connecting the output terminal of the IC timer 32 to the reset terminal of the IC timer 42 as shown in FIGS. 1A and 1B thereby using the IC timer 32 output voltage waveform both as a trigger and a reset signal for the IC timer 42. This achieves the desired coincidence of the two timer output waveforms when the output of the timer 32 goes low with only a small step change occurring in the duration of the one-shot 40 output pulse signal, the cause of which will be explained further on. The transistor 54 together with the diode 57 prevents the discharge of the timing capacitor 43 until the timing capacitor 33 is discharged, and also prevents the timing capacitor 43 from charging above the threshold voltage level of the IC timer 42 to prevent interaction between the generator frequency and pulse duration adjustments as follows. When the voltage across the one-shot 40 timing capacitor 43 reaches the threshold voltage level of the IC timer 42, the IC timer output goes low and the IC timer internal discharge transistor turns on and sinks base current from the transistor 54 turning it on. Transistor 54 then clamps the anode of the diode 57 at the emitter voltage, approximately 0.2 V, and halts further charging of the timing capacitor 43 by diverting the charging current flowing through the charging resistance 44 to electrical circuit ground as mentioned above.

Figure 5:
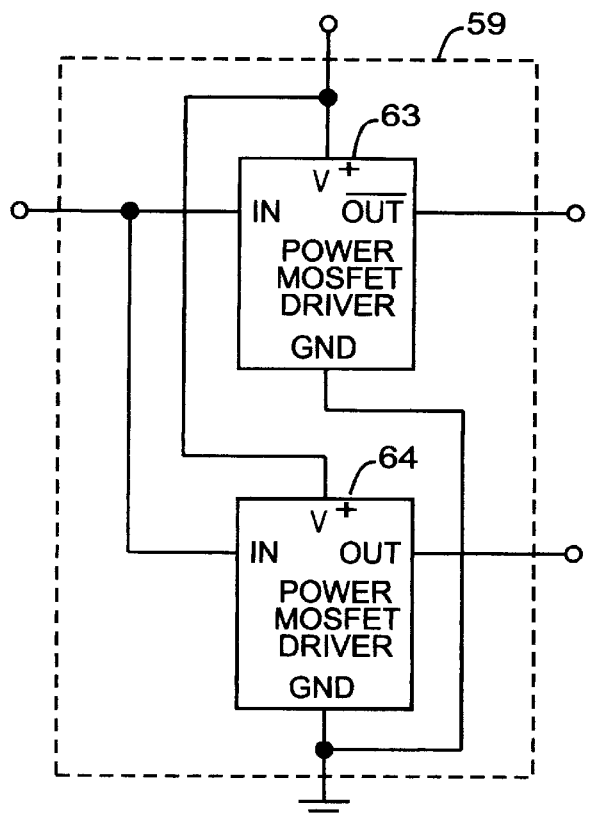
FIG. 5 shows a schematic of a preferred embodiment of the power amplifier in the circuit shown in FIGS. 1A and 1B.

The bipolar and CMOS 555 IC timers that can be used in the generator can source or sink load currents up to 200 mA and 100 mA respectively. Connecting loads directly to the IC timer 42 output, however, causes considerable jitter of the IC timer output pulse signal waveform, even at extremely low load current levels, i.e., below 0.5 mA. To minimize the waveform jitter, which will be described in detail further on, the output of the IC timer 42 is isolated from the load by an isolated circuit 70 comprised of an insulated-gate field-effect transistor (IGFET) 71, the drain terminal of which is connected to a power amplifier 59 comprising a dual power (DP) MOSFET driver 60 with an inverting and a non-inverting output as shown in FIG. 1B, and a pull-up resistor 72. Power to the DP MOSFET driver 60 is supplied by an adjustable dc voltage regulator 61 as shown in FIGS. 1A and 1B, the output of which can be varied from 5 to 17 Vdc thus enabling the power amplifier 59 to provide output voltage waveforms that have both a variable duty cycle and a variable amplitude over a wide load range. The DP MOSFET driver 60 utilized in the generator can source or sink a continuous 100 mA load current while simultaneously powering a 1000 picofarad (pF) capacitive load. A preferred embodiment of the generator power amplifier 59, which is shown in FIG. 5, is comprised of two single output power MOSFET drivers 63 and 64 in place of the dual unit to provide the equivalent inverting and non-inverting outputs respectively. Both of these integrated circuits have a lower output impedance than the DP MOSFET driver 60 and can advantageously source or sink load currents greater than 200 mA while simultaneously powering a 2500 pF capacitive load. In addition, all of the aforementioned power MOSFET drivers provide output voltage waveforms with maximum rise and fall times of 30 nanoseconds (ns) while fully loaded; considerably lower than those of commercially available comparable electronic instruments that experience severe output waveform degradation at the aforementioned load conditions.

As per the manufacturer's specifications, the voltage differential between any power MOSFET driver input terminal and electrical circuit ground cannot exceed ($V_s$+0.3V) to (electrical ground –0.3V) where $V_s$ is the power MOSFET driver supply voltage. To meet this specific power MOSFET driver safe operating limit, which is calculated to be 5.6 Vdc at the DP MOSFET driver 60 supply voltage lower limit of 5 Vdc, power to the IGFET 71 is supplied by a 5 V dc voltage regulator 62, as shown in FIG. 1B, which acts as a voltage level shifter to step-down the amplitude of the one-shot 40 output pulse signal waveform from 10V to 5V at the DP MOSFET driver 60 input terminals.

FIG. 4A shows the stepped-down waveform F, inverted by the IGFET 71, which is applied to the DP MOSFET driver 60 inputs. The inverting output of the DP MOSFET driver 60 inverts the waveform F and puts forth an output voltage waveform G that is back in phase with the output waveform E of the one-shot 40 and can be varied in amplitude from 5 to 17 volts. The output voltage waveform provided by the non-inverting DP MOSFET driver 60 output is the inverse of the waveform B.

Waveform H in FIG. 4A illustrates the voltage waveform provided by the inverting output of the DP MOSFET driver 60 at an 80% duty cycle where T1 and T2 have durations of 8 us and 2 us respectively with the generator operating frequency still set at 100 kHz. At this operating condition, the DP MOSFET driver 60 output voltage waveform durations replicate those of the AFA oscillator 30 output voltage waveform (compare the waveforms B and H). This is the minimum duration that T2 can be set at throughout the entire generator operating frequency and duty cycle range before the potentiometers 46 and 47 lose control of the duty cycle. Here, the voltage across the timing capacitor 43 reaches the threshold voltage level of the IC timer 42 just before the reset signal (IC timer 32 output goes low) is applied to the IC timer 42 so that the one-shot 40 still times out normally. At this juncture, any minute potentiometer adjustment that tends to reduce the duration of T2, such as reducing the charging resistance 34 to increase the AFA oscillator 30 operating frequency, or, increasing the charging resistance 44 to increase the one-shot 40 output pulse signal duration, will cause the reset signal to be coincident with the time when the voltage across the timing capacitor 43 reaches the threshold voltage level of the IC timer 42.

Assume for example that the peak voltage of the timing capacitor 43 and the reset signal coincide due to an increase in the charging resistance 44 to increase the one-shot 40 output pulse signal duration. The IC timer 42 internal reset circuit immediately inhibits the IC timer threshold circuit and the one-shot 40 output pulse signal goes low after a 0.4 us delay. This delayed response is due to the 555 IC timer which has an inherent 0.4 us delay time before the 555 IC timer output responds to a reset signal. Due to the time delay, the durations of T1 and T2 of the waveform H undergo a 0.4 us step change, T1 increasing from 8 to 8.4 us and T2 decreasing from 2 to 1.6 us as illustrated by waveform I in FIG. 4A. The AFA oscillator 30 now completely controls the one-shot 40 timing cycle, both initiating and terminating the formation of the one-shot output pulse signal via the trigger and reset signals respectively. The one-shot 40 and DP MOSFET driver 60 output voltage waveforms then replicate the AFA oscillator 30 output voltage waveform with a 0.4 us difference in the duration of $T_h$ and T1, and $T_1$ and T2 respectively throughout the entire generator operating frequency range as long as the reset signal continues to command the termination of the one-shot timing cycle as will be shown further on. The aforementioned DP MOSFET driver 60 output voltage waveform durations are maintained and the generator operating frequency remains fixed at precisely 100 kHz as the charging resistance 44 is increased still further. As the charging resistance 44 is increased to its maximum value, the total resistance of the resistor 45 and potentiometers 46 and 47, the positive and negative slopes and average dc level of the timing capacitor 43 voltage waveform D continually decrease, the voltage waveform D eventually becoming a straight line with a dc voltage level of 0.8 V as illustrated by waveform J in FIG. 4B.

To further illustrate the operation of the generator, assume that as a first step in establishing a generator output voltage waveform with a frequency of 20 Hz and a 20%. duty cycle, the charging resistance 44 is gradually decreased from its present maximum value to a lower value that yields a one-shot 40 output pulse signal duration slightly below 10 ms. This process does not change the durations of T1 and T2 of the waveform I or the generator operating frequency which stays fixed at 100 kHz. Now, however, as the AFA oscillator 30 operating frequency is reduced by increasing the charging resistance 34, the one-shot 40 and DP MOSFET driver 60 output voltage waveforms track the AFA oscillator output voltage waveform, the duration of T1 increasing in lock step with that of $T_h$ of the AFA oscillator output voltage waveform B while the duration of T2 stays fixed at 1.6 us. Simultaneously, the slopes and dc voltage level of the timing capacitor 43 voltage waveform gradually increase until the peak voltage across the timing capacitor reaches the threshold voltage level of the IC timer 42 and becomes coincident with the AFA oscillator 30 reset signal once again when the operating frequency adjustment "catches up" to the aforementioned one-shot 40 output pulse signal duration setting (see waveform K in FIG. 4B) which occurs at a frequency just under 100 Hz, 99.984 Hz to be precise. With a minute increase in the charging resistance 34 which "nudges" the operating frequency lower, the control of the one-shot 40 timing cycle reverts back to the IC timer 42 threshold circuit and the generator output voltage waveform K undergoes a reverse 0.4 us step change, the duration of T1 decreasing by 0.4 us and the duration of T2 increasing from 1.6 to 2 us as illustrated by waveform L. As the charging resistance 34 is increased still further, the duration of T1 stays fixed at (10 ms–0.4 us) and the duration of T2 increases with decreasing frequency to (40 ms+0.4 us) at which point the desired operating frequency of 20 Hz is obtained. With a slight increase in the charging resistance 44, the generator output pulse signal duration is increased to 10 ms and the desired 20%. duty cycle is also obtained as illustrated by waveform M in FIG. 4B.

The sequence just described goes in reverse when the generator operating frequency is increased from 20 Hz back up to 100 kHz with the one-shot 40 charging resistance 44 held at the recently established 10 ms setting. As the generator operating frequency is continuously increased by decreasing the charging resistance 34, the generator and one-shot 40 output pulse signal duration, T1, now "steps up" 0.4 us to (10 ms+0.4 us) when the IC timer 42 reset circuit again overrides the IC timer threshold circuit before decreasing in lock step with the duration, $T_h$, of the AFA oscillator 30 output voltage waveform while T2 remains fixed at 1.6 us as before. At 100 kHz, the generator provides the voltage waveform I again wherein the durations of T1 and T2 are 8.4 us and 1.6 us respectively as shown in FIG. 4A. By reducing the charging resistance 44 from the 10 ms setting until the IC timer 42 threshold circuit regains control of the one-shot 40 timing cycle, the generator output pulse signal duration, T1, "steps back" 0.4 us and the generator "starting point" output voltage waveform H is restored.

The foregoing illustrative examples of generator operation were selected specifically to illustrate the very small step change in output waveform duration that can occur depending on how a user of the generator decides to make the operating frequency and pulse signal duration adjustments. Consequently, these examples clearly demonstrate that the invention described herein has solved the instability problem at high duty cycles, described previously herein, which is prevalent in commercially available comparable electronic instruments.

Figure 4B:
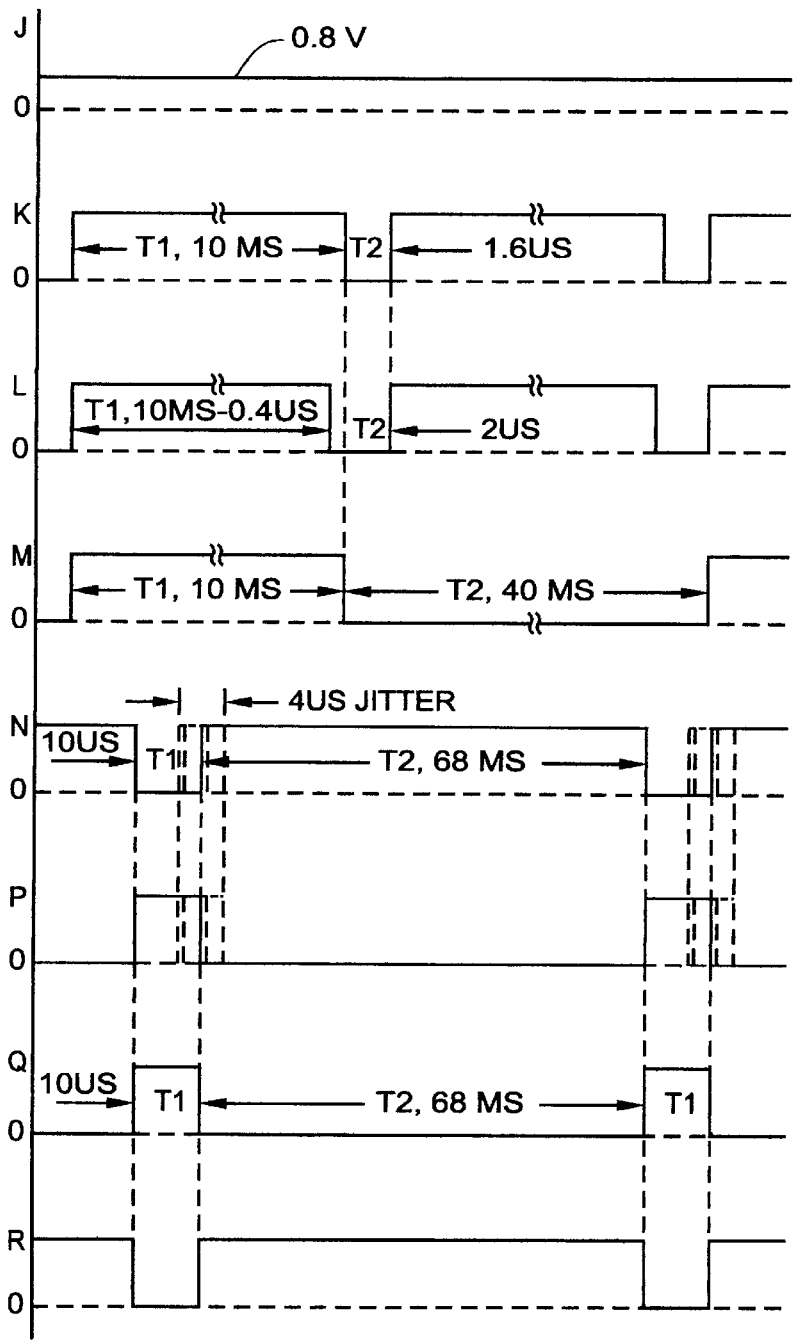

The generator output voltage waveforms exhibit very small fluctuations in the durations of T1 and T2 which are due to random cycle-to-cycle variations in the duration of the one-shot 40 output pulse signal, defined herein as jitter. The jitter, which was mentioned earlier herein, increases proportionally as the duration of the one-shot 40 output pulse signal is increased, reaching a peak of 3 to 4 us at the maximum attainable one-shot output pulse signal duration which is approximately 68 ms. Expressed in percentage terms, the generator waveform jitter is therefore less than 0.006% throughout the generator operating frequency range, considerably less than available comparable instruments. FIG. 4B illustrates the worst-case jitter component of the output voltage waveform N provided by the DP MOSFET driver 60 inverting output at the lowest generator operating frequency, approximately 14.7 Hz, with the durations of T1 and T2 nominally set at 68 ms and 10 us respectively, which is within several microseconds of the generator maximum attainable duty cycle. The complementary (non-inverting DP MOSFET driver 60 output voltage waveform is illustrated by waveform P. Waveforms N and P are shown as displayed on a laboratory oscilloscope with the jitter referenced to the trailing and leading edges of these waveforms respectively to enable the magnitude of the worst case jitter to be viewed and measured. With the duration of T1 held at 68 ms, as the nominal duration of T2 is gradually reduced below 10 us by increasing the AFA oscillator 30 operating frequency, at some point the jitter begins causing the control of the one-shot 40 timing cycle to randomly shift back and forth between the IC timer 42 internal reset and threshold circuitry. The IC timer 42 reset circuit eventually gains complete control causing the duration of T1 of waveform N to permanently "step-up" 0.4 us, and the duration of T2 to "step-back" the same amount and remain fixed at 1.6 us as previously described. Any waveform jitter is totally eliminated when this occurs.

A major cause of the generator output voltage waveform jitter is the combined peak-to-peak ripple and noise (PPRN), $\Delta V_{p-p}$, present on the one-shot 40 10 V supply voltage, $V_s$, which also appears at the IC timer 42 threshold comparator input at a reduced level of $\frac{2}{3} \Delta V_{p-p}$ due to the three-resistor divider chain within a 555 IC timer. Consequently, the IC timer 42 threshold voltage level at any instant of time varies randomly between $\frac{2}{3} V_s +/- \frac{1}{3} \Delta V_{p-p}$ thereby causing the cycle-to-cycle variation in the durations of T1 and T2 exhibited by waveforms N and P.

Figure 6:
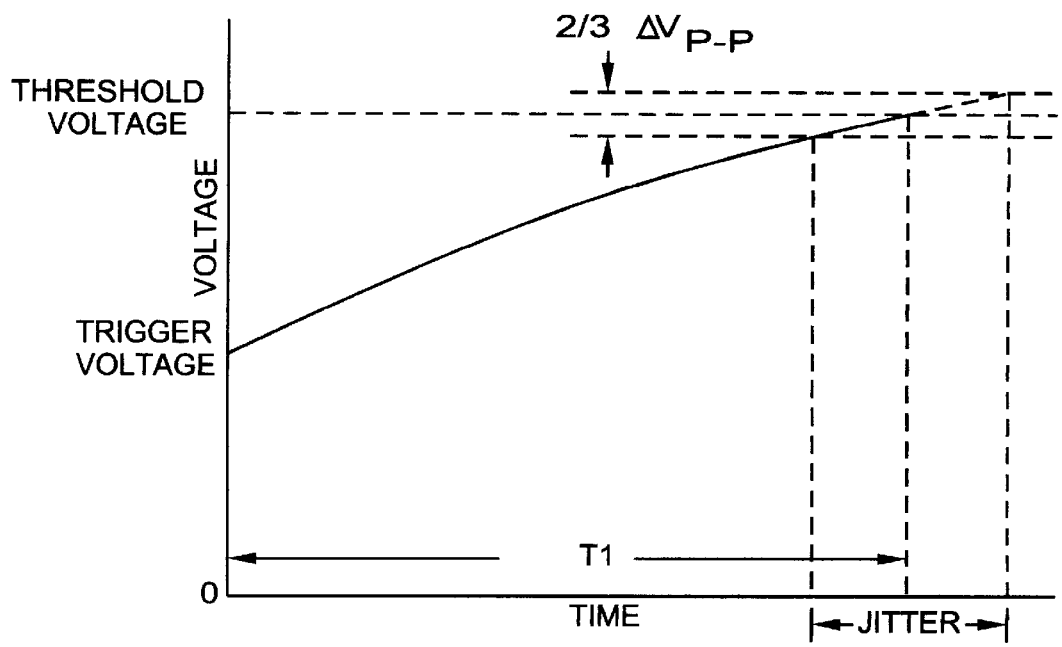
FIG. 6 illustrates the voltage waveform jitter across a timing capacitor in the circuit shown in FIGS. 1A and 1B.

FIG. 6 shows the charging portion of the timing capacitor 43 voltage waveform with the magnitudes of the PPRN and resultant jitter limits exaggerated for clarity. The voltage across the timing capacitor 43 increases exponentially, however, a rough estimate of the jitter magnitude can be obtained by applying similar triangles in FIG. 6 to derive the following equation:

$$Jitter = \frac{2/3 \Delta V_{p-p} T1}{1/3 V_S} = \frac{2 \Delta V_{p-p} T1}{V_S}$$

Thus, when T1=68 ms, $\Delta V_{p-p}$=0.3 mV, and $V_S$=10 V, the jitter=4 us which is the maximum jitter exhibited by the generator output voltage waveforms. When T1=10 us, the jitter=0.6 ns which is negligible. Since the jitter decreases proportionally as the duration of the one-shot 40 output pulse signal decreases, generator output voltage waveforms with very high duty cycles and little to no jitter can be obtained from the DP MOSFET driver 60 non-inverting output throughout the generator operating frequency range if so desired. This is easily accomplished by first setting the AFA oscillator 30 frequency and then setting the one-shot 40 output pulse signal of short duration that provides the desired high duty cycle output voltage waveform from the non-inverting output of the DP MOSFET driver 60. Waveforms Q and R in FIG. 4B illustrate the voltage waveforms obtained from the non-inverting and inverting outputs respectively of the DP MOSFET driver 60 as viewed on an oscilloscope where the durations of T1 and T2, 10 us and 68 ms respectively, are the reverse of those of waveforms N and P. No discernible waveform jitter was observed when T1 is 10 us in accordance with the calculated result from the above equation.

To reduce the PPRN, and thereby the generator output voltage waveform jitter:

a. a filter capacitor 90 is connected from the supply voltage terminal of the IC timer 32 to electrical circuit ground as shown in FIG. 1A;

b. a low-pass filter 91 comprising an inductor 92 and a filter capacitor 93 is connected as shown in FIG. 1B to provide further reduction of the PPRN at the one-shot 40; and c. second low pass filter 95 comprising an inductor 96 and a filter capacitor 97 is connected between the variable dc voltage regulator 61 output and the DP MOSFET driver 60 as shown in FIG. 1B.

While the invention has been described in terms of particular embodiments thereof, many other variations and modifications will become apparent to those skilled in the art. For example, in the types of integrated circuits such as timers and power MOSFET drivers used therein, and in the specific circuit arrangements for performing the essential functions or operations of a pulse generator in accordance with the invention. Therefore, the present invention should not be limited by the specific disclosure herein, but only by the appended claims.

What I claim as my invention is:

1. An apparatus for generating a train of repetitive electrical pulses of variable frequency, duration, and amplitude wherein wide pulse duration and frequency ranges are achieved with single adjustments respectively, said apparatus comprising:

(a) first and second inputs connected to respective first and second outputs of a dc power source, and first, second and third outputs; said second input and said third output of said apparatus connected to electrical circuit ground;

(b) a variable dc voltage regulator and first and second dc voltage regulators to provide dc power to electrical circuitry contained within said apparatus, said variable dc voltage regulator further enabling said apparatus to generate said repetitive electrical pulses having a variable amplitude characteristic; each of said dc voltage regulators having an input terminal connected to said first input of said apparatus, an electrical ground terminal connected to said electrical circuit ground, and an output terminal;

(c) first and second low-pass filters to reduce the peak-to-peak ripple and noise present on the respective output voltages of said first and said variable dc voltage regulators thereby reducing jitter of said generated pulse train of said apparatus; each of said low-pass filters having an input and first and second outputs; said input of said first low-pass filter connected to said output terminal of said first dc voltage regulator, said input of said second low-pass filter connected to said output terminal of said variable dc voltage regulator, and each of said second outputs of said first and second low-pass filters connected to said electrical circuit ground;

(d) an astable oscillator for generating a repetitive rectangular waveform of variable frequency; said astable oscillator having an input connected to said output terminal of said first dc voltage regulator, and first and second outputs; said second output connected to said electrical circuit ground;

(e) a trigger circuit for generating a trigger signal whenever said repetitive rectangular waveform generated by said astable oscillator goes high; said trigger circuit having a first input connected to said first output of said astable oscillator, a second input connected to said output terminal of said first dc voltage regulator, and first and second outputs; said second output connected to said electrical circuit ground;

(f) a monostable pulse generator supplying individual pulses of variable duration upon receiving said trigger signal from said trigger circuit; said monostable pulse generator having a first input connected to said first output of said trigger circuit, a second input connected to said first output of said astable oscillator, a third input connected to said first output of said first low-pass filter, and first and second outputs; said second output connected to said electrical circuit ground;

(g) an isolation circuit for electrically isolating said first output of said monostable pulse generator from electrical loads such as continuous and capacitive loads connected to said first and second outputs of said apparatus thereby effecting a further reduction in said jitter of said pulse train generated by said apparatus; said isolation circuit having a first input connected to said first output of said monostable pulse generator, a second input connected to said output terminal of said second dc voltage regulator, and first and second outputs; said second output connected to said electrical circuit ground; and (h) a power amplifier for generating said pulse train of variable amplitude, wherein said pulse train has fast rise and fall times, and provides sufficient energy to simultaneously power said continuous and capacitive electrical loads with minimal effect on the waveshape of said pulse train; said power amplifier having a first input connected to said first output of said isolation circuit, a second input connected to said first: output of said second low-pass filter, first and second outputs connected to said first and second outputs respectively of said apparatus, and a third output connected to said electrical circuit ground.

2. An apparatus as in claim 1 wherein each of said first and second low-pass filters comprise:

(a) an inductor connected between said input and said first output of said low-pass filter; and (b) a filter capacitor connected between said first and second outputs of said low-pass filter.

3. An apparatus as in claim 1 wherein said astable oscillator comprises:

(a) an integrated circuit timer having output, trigger, threshold, dc supply voltage, control, and electrical ground terminals; said dc supply voltage terminal connected to said input of said astable oscillator, said output terminal connected to said first output of said astable oscillator, said trigger and threshold terminals connected together, and said electrical ground terminal connected to said second output of said astable oscillator;

(b) a timing capacitor connected between said threshold terminal of said integrated circuit timer and said second output of said astable oscillator;

(c) a transistor to discharge said timing capacitor whenever said repetitive rectangular waveform generated by said astable oscillator goes low; said transistor having a collector terminal connected to said second output of said astable oscillator, and base and emitter terminals;

(d) a first resistor connected between said threshold terminal of said integrated circuit timer and said emitter terminal;

(e) a diode connected to protect the base-to-emitter junction of said transistor from reverse voltage breakdown; said diode having a cathode terminal connected to said first output of said astable oscillator, and an anode terminal;

(f) a second resistor connected between said anode terminal of said diode and said base terminal;

(g) a charging resistance to adjust said variable frequency of said repetitive electrical pulse train generated by said apparatus; said charging resistance having a first terminal connected to said threshold terminal of said integrated circuit timer and a second terminal connected to said input of said astable oscillator; said charging resistance further comprising a third resistor and first and second variable resistors connected serially between said first and second terminals; and (h) a filter capacitor connected between said control terminal of said integrated circuit timer and said second output of said astable oscillator.

4. An apparatus as in claim 1, wherein said monostable pulse generator comprises:

(a) an integrated circuit timer having output, discharge, reset, trigger, threshold, dc supply voltage, control, and electrical ground terminals; said trigger, reset and dc supply voltage terminals connected to said first, second, and third inputs respectively of said monostable pulse generator, and said output and electrical ground terminals connected to said first and second outputs respectively of said monostable pulse generator;

(b) a timing capacitor connected between said threshold terminal of said integrated circuit timer and said second output of said monostable pulse generator;

(c) a first transistor to discharge said timing capacitor, said timing capacitor being discharged whenever said repetitive rectangular waveform generated by said astable oscillator goes low; said first transistor having a collector terminal connected to said second output of said monostable pulse generator, and base and emitter terminals;

(d) a first resistor connected between said threshold terminal of said integrated circuit timer and said emitter terminal of said first transistor;

(e) a first diode to protect the base-to-emitter junction of said first transistor from reverse voltage breakdown; said first diode having a cathode terminal connected to said second input of said monostable pulse generator, and an anode terminal;

(f) a second resistor connected between said anode terminal of said first diode and said base terminal of said first transistor;

(g) a second transistor, said second transistor turning on immediately upon said monostable pulse generator completing the formation of an output pulse thereby to halt further charging of said timing capacitor by diverting charging current to said timing capacitor to said electrical circuit ground thereupon preventing interaction between said frequency and pulse duration adjustments of said apparatus; said second transistor having a collector terminal connected to said second output of said monostable pulse generator, and base and emitter terminals;

(h) a second diode connected to block, and thereby delay, the discharge of said timing capacitor until such time as said timing capacitor is discharged by said first transistor; said second diode having a cathode terminal connected to said threshold terminal of said integrated circuit timer and an anode terminal connected to said emitter terminal of said second transistor;

(i) a third resistor connected between said base terminal of said second transistor and said discharge terminal of said integrated circuit timer;

(j) a charging resistance to adjust said variable duration of said repetitive electrical pulses generated by said apparatus; said charging resistance having a first terminal connected to said anode terminal of said second diode, and a second terminal connected to said third input of said monostable pulse generator; said charging resistance further comprising a fourth resistor and first and second variable resistors connected serially between said first and second terminals; and (k) a filter capacitor connected between said control terminal of said integrated circuit timer and said second output of said monostable pulse generator.

5. An apparatus as in claim 1 wherein said isolation circuit comprises:

(a) an insulated-gate field-effect transistor having a gate terminal connected to said first input of said isolation circuit, a drain terminal connected to said first output of said isolation circuit, and a source terminal connected to said second output of said isolation circuit; and (b) a resistor connected between said drain terminal of said insulated-gate field-effect transistor and said second input of said isolation circuit.

6. An apparatus as in claim 1 wherein said power amplifier comprises:

a dual power metal oxide semiconductor field-effect transistor (MOSFET) driver having first and second input terminals connected together and to said first input of said power amplifier, a dc supply voltage terminal connected to said second input of said power amplifier, inverting and non-inverting output terminals connected to said first and second outputs respectively of said power amplifier, and an electrical ground terminal connected to said third output of said power amplifier.

7. A power amplifier as in claim 6, wherein said power amplifier may alternatively comprise:

a first power MOSFET driver having an inverting output terminal, a second power MOSFET driver having a non-inverting output terminal, and each of said first and second power MOSFET drivers having input, dc supply voltage, and electrical ground terminals;

said input terminals of said first and second power MOSFET drivers connected together and to said first input of said power amplifier;

said dc supply voltage terminals of said first and second power MOSFET drivers connected together and to said second input of said power amplifier;

said inverting output terminal of said first power MOSFET driver connected to said first output of said power amplifier;

said non-inverting output terminal of said second power MOSFET driver connected to said second output of said power amplifier; and said electrical ground terminals of said first and second power MOSFET drivers connected together and to said third output of said power amplifier.

8. An apparatus as in claim 1 further comprising a filter capacitor connected between said input of said astable oscillator and said electrical circuit ground to reduce said peak-to-peak ripple and noise present on said output voltage of said first dc voltage regulator at said input of said astable oscillator.

9. An apparatus as in claim 1, said train of electrical pulses of variable frequency, duration and amplitude generated by said apparatus further having high duty cycles throughout said frequency range of said apparatus with minimal instability of the output waveform period at said high duty cycles.

\* \* \* \* \*

UNITED STATES PATENT AND TRADEMARK OFFICE
CERTIFICATE OF CORRECTION

PATENT NO. : 6,060,931
DATED : May 9, 2000
INVENTOR(S) : George J. Stahl

It is certified that error appears in the above-indentified patent and that said Letters Patent is hereby corrected as shown below:

Column 1, line 23, change '94%.' to -- 94% --.

Column 1, line 25, change '50%.' to -- 50% --.

Column 5, line 12, change '20%.' to -- 20% --.

Column 6, line 46, change 'two-circuit' to -- two circuit --.

Column 6, line 46, conclude paragraph b. of the invention description narrative with the sentence ending with the words -- ... described above. --.

Column 6, line 47, begin a new paragraph with the next sentence in the invention description narrative that begins with the words -- The latter of the two circuit operations ... --.

Column 7, line 15, change 'isolated' to -- isolation --.

Column 7, line 64, change 'waveform B' to -- waveform G --.

Column 8, line 39, change '$T_1$' to -- $T_2$ --

UNITED STATES PATENT AND TRADEMARK OFFICE
CERTIFICATE OF CORRECTION

PATENT NO. : 6,060,931
DATED : May 9, 2000
INVENTOR(S) : George J. Stahl

It is certified that error appears in the above-identified patent and that said Letters Patent is hereby corrected as shown below:

Column 8, line 56, change '20%.' to -- 20% --.
Column 9, line 24, change '20%.' to -- 20% --.
Column 10, line 6, change '(non-inverting' to -- (non-inverting) --.
Column 10, line 44, change '$V_s = 10V$' to -- $V_s = 10V$ --.
Column 12, line 34, change 'first:' to -- first --.

Signed and Sealed this

Fifteenth Day of May, 2001

Attest:

NICHOLAS P. GODICI

Attesting Officer

Acting Director of the United States Patent and Trademark Office